(12) United States Patent
Chen

(10) Patent No.: US 11,112,877 B2
(45) Date of Patent: Sep. 7, 2021

(54) KEYBOARD SCANNING CIRCUIT AND CONTROL METHOD THEREOF

(71) Applicant: Chicony Electronics Co., Ltd., New Taipei (TW)

(72) Inventor: Chien-Tsung Chen, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 75 days.

(21) Appl. No.: 16/785,936

(22) Filed: Feb. 10, 2020

(65) Prior Publication Data

US 2020/0310554 A1   Oct. 1, 2020

Related U.S. Application Data

(60) Provisional application No. 62/825,840, filed on Mar. 29, 2019.

(51) Int. Cl.
*G06F 3/02* (2006.01)
*H03M 11/20* (2006.01)

(52) U.S. Cl.
CPC .......... *G06F 3/0202* (2013.01); *H03M 11/20* (2013.01)

(58) Field of Classification Search
CPC .............................. G06F 3/0202; H03M 11/20
See application file for complete search history.

(56) References Cited

U.S. PATENT DOCUMENTS

| 5,151,554 | A | * | 9/1992 | Matsuda | G10H 1/182 340/2.4 |
|---|---|---|---|---|---|
| 2011/0309956 | A1 | * | 12/2011 | Westhues | H03M 11/003 341/22 |
| 2012/0262376 | A1 | * | 10/2012 | Li | H03M 11/20 345/168 |
| 2013/0257633 | A1 | * | 10/2013 | Chen | G06F 3/02 341/22 |
| 2015/0206672 | A1 | * | 7/2015 | Hsu | G06F 3/023 307/115 |
| 2017/0141792 | A1 | * | 5/2017 | Chou | H03K 17/967 |
| 2017/0147086 | A1 | * | 5/2017 | Lee | H03M 11/20 |

FOREIGN PATENT DOCUMENTS

| CN | 106876203 A | 6/2017 |
|---|---|---|
| TW | 330259 B | 4/1998 |
| TW | 201037978 A | 10/2010 |
| TW | 201709676 A | 3/2017 |

* cited by examiner

*Primary Examiner* — Amit Chatly
(74) *Attorney, Agent, or Firm* — Muncy, Geissler, Olds & Lowe, P.C.

(57) ABSTRACT

A keyboard scanning circuit and control method thereof are provided. The method is adapted to detect states of a plurality of switching circuits arranged in an array manner, wherein each of the switching circuits includes a key switch and a first resistor connected in series; the switch circuits are coupled to a plurality of scan lines and a plurality of feedback lines; each of the scan lines is coupled to the switch circuits of the same column in a first direction, and each of the feedback lines is coupled to the switch circuits of the same row in the second direction.

11 Claims, 12 Drawing Sheets

KEYBOARD SCANNING CIRCUIT AND CONTROL METHOD THEREOF

CROSS-REFERENCES TO RELATED APPLICATIONS

This application claims the priority benefit of U.S. provisional application Ser. No. 62/825,840, filed on Mar. 29, 2019 and Patent Application No. 108120795 filed in Taiwan, R.O.C. on Jun. 14, 2019. The entirety of the above-mentioned patent applications are hereby incorporated by references herein and made a part of the specification.

BACKGROUND

Technical Field

The instant disclosure relates to a keyboards field, and more particularly, to a keyboard scanning circuit and a control method thereof.

Related Art

At the present day, the keyboard scanning circuit uses an analog comparator to determine the state of the switch, but the analog comparator has many disadvantages, such as: large volume, poor anti-noise capability, inability to save power, and long scanning time. In addition, some keyboard scanning circuits use analog digital converters, which have the disadvantage of complicated circuits.

SUMMARY

To address the above issue(s), the instant disclosure provides a keyboard scanning circuit and a control method thereof.

In an embodiment of the instant disclosure, a keyboard scanning circuit is provided. The keyboard scanning circuit comprises: a digital output circuit, a digital input circuit, a plurality of switch circuits, a plurality of scan lines, a plurality of feedback lines, and a controller. The digital output circuit is for outputting a high state output voltage ($V_{OH}$) and a low state output voltage ($V_{OL}$). The digital input circuit is for receiving output signals and determining a logic signal corresponding to each of the output signals to be a high logic level or a low logic, according to a high state threshold voltage ($V_{TH}$) and a low state threshold voltage ($V_{TL}$). The switch circuits are arranged in an array manner, and each of the switching circuits comprises a key switch and a first resistor connected in series to the key switch.

Each of the scan lines comprises: an input terminal and a plurality of switch terminals. The input terminal is coupled to the digital output circuit and is for receiving an input signal output by the digital output circuit. In a scanning round, the input signal received by one of the scan lines is a detection signal (V2), the input signal received by rest of the scan lines is a level signal (V1), wherein the detection signal (V2) and the level signal (V1) are a combination of the high state output voltage ($V_{OH}$) and the low state output voltage ($V_{OL}$). The switch terminals of each of the scan lines are respectively coupled to, in a one-to-one manner, the switch circuits of the same column in a first direction.

Each of the feedback lines comprises: a connecting terminal and an outputting terminal. The connecting terminal is coupled to the switch circuits of the same row in a second direction. The outputting terminal is coupled to the digital input circuit and is for outputting the output signal.

The controller is coupled to the digital output circuit and the digital input circuit. The controller is adapted to control the digital output circuit to perform the scanning round, receive the logic signals from the digital input circuit, and determine the key switches of the switch circuits coupled to the scan line receiving the detection signal (V2) is in a connection state or a disconnection state respectively, according to whether each of the logic signals is the high logic level or the low logic level in the scanning round. Wherein, the high state output voltage ($V_{OH}$), the low state output voltage ($V_{OL}$), the high state threshold voltage ($V_{TH}$), and the low state threshold voltage ($V_{TL}$) satisfy a threshold inequality as shown below, n is the number of the connection states of the key switches of the switch circuits coupled to any feedback line.

$$\begin{cases} V_{OH} > V_{TH} > \dfrac{V2 + (n-1)*V1}{n} > V_{TL} > V_{OL}, \\ \quad \text{when } \dfrac{V2 + (n-1)*V1}{n} > V_{TL} \\ V_{OH} > V_{TH} \geq V_{TL} > \dfrac{V2 + (n-1)*V1}{n} > V_{OL}, \\ \quad \text{when } V_{TL} > \dfrac{V2 + (n-1)*V1}{n} \end{cases}$$

In an embodiment of the instant disclosure, a control method for keyboard scanning circuit, adapted to detect states of a plurality of switching circuits arranged in an array manner is provided. Each of the switching circuits comprises a key switch and a first resistor connected in series. The switch circuits are coupled to a plurality of scan lines and a plurality of feedback lines. Each of the scan lines is coupled to the switch circuits of the same column in a first direction and each of the feedback lines is coupled to the switch circuits of the same row in the second direction. The control method comprises: setting a detection signal (V2) and a level signal (V1) to be a combination of a high state output voltage ($V_{OH}$) and a low state output voltage ($V_{OL}$) according to the high state output voltage ($V_{OH}$) and the low state output voltage ($V_{OL}$); outputting an input signal to the scan lines respectively, wherein in a scanning round, the input signal received by one of the scan lines is a detection signal (V2), and the input signal received by rest of the scan lines is a level signal (V1); receiving a plurality of output signals generated in response to the states of the switch circuits, the detection signal (V2), and the level signal (V1) from the feedback lines; and determining a logic signal corresponding to each of the output signals is a high logic level or a low logic level according to the high state threshold voltage ($V_{TH}$) and the low state threshold voltage ($V_{TL}$), and determining the key switches of the switch circuits coupled to the scan line receiving the detection signal (V2) is in a connection state or a disconnection state respectively, according to whether each of the logic signals is the high logic level or the low logic level in the scanning round. Wherein, the high state output voltage ($V_{OH}$), the low state output voltage ($V_{OL}$), the high state threshold voltage ($V_{TH}$), and the low state threshold voltage ($V_{TL}$) satisfy a threshold inequality as shown below. n is the number of the connection states of the key switches of the switch circuits coupled to any feedback line.

$$\begin{cases} V_{OH} > V_{TH} > \dfrac{V2 + (n-1)*V1}{n} > V_{TL} > V_{OL}, \\ \quad \text{when } \dfrac{V2 + (n-1)*V1}{n} > V_{TL} \\ V_{OH} > V_{TH} \geq V_{TL} > \dfrac{V2 + (n-1)*V1}{n} > V_{OL}, \\ \quad \text{when } V_{TL} > \dfrac{V2 + (n-1)*V1}{n} \end{cases}$$

As above, according to one or some embodiments of the keyboard scanning circuit and the control method thereof of the instant disclosure, the keyboard scanning circuit and the control method thereof can avoid ghost keys, reduce process complexity, and provide power-saving and wake-up function.

DETAILED DESCRIPTION

Figure 1:
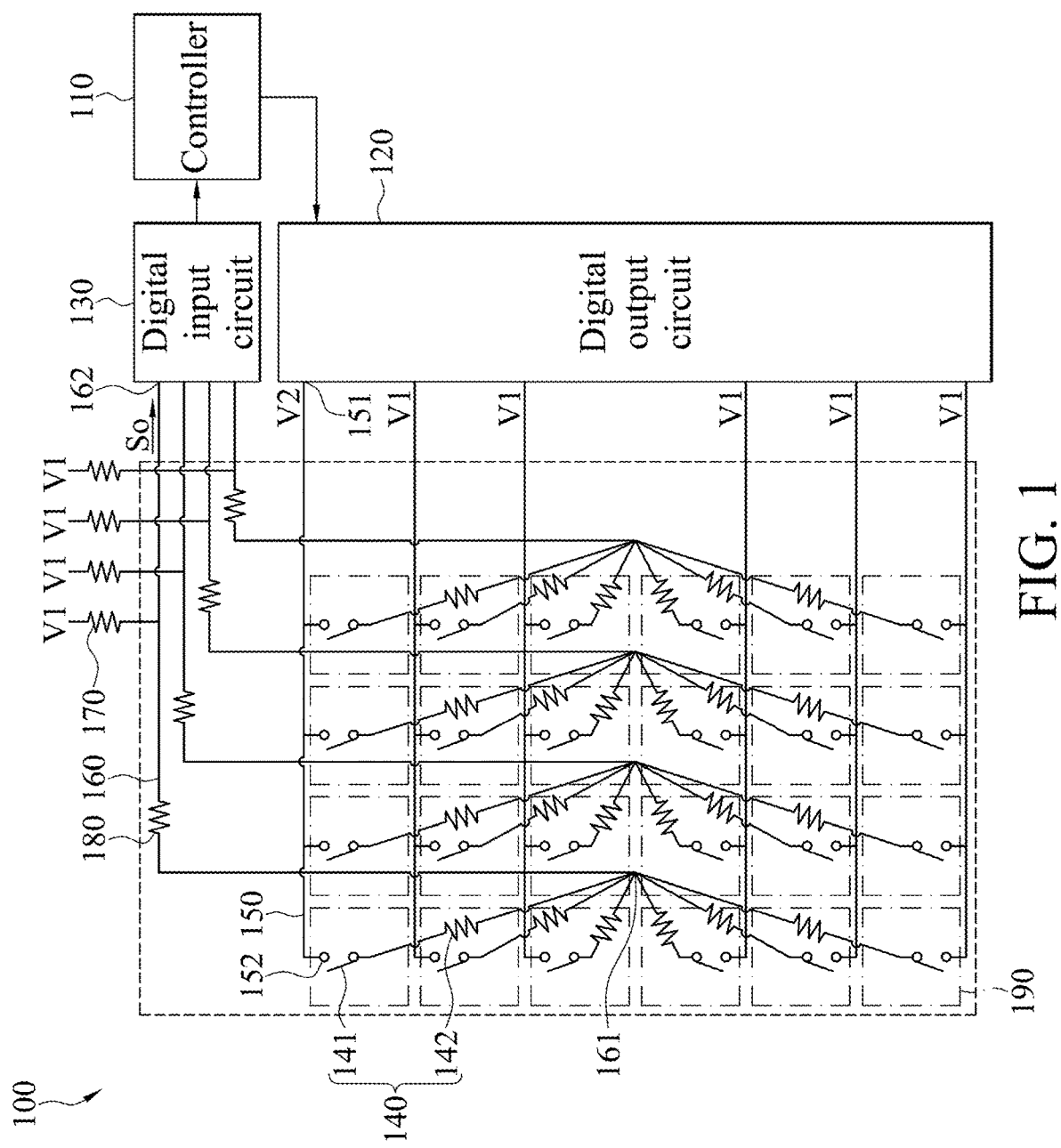
FIG. 1 illustrates a schematic view of a keyboard scanning circuit according to an embodiment of the instant disclosure.

FIG. 1 is a schematic view of a keyboard scanning circuit 100 according to an embodiment of the instant disclosure.

The keyboard scanning circuit 100 comprises a controller 110, a digital output circuit 120, a digital input circuit 130, a plurality of switching circuits 140, a plurality of scan lines 150, and a plurality of feedback lines 160.

The controller 110 is coupled to the digital output circuit 120 and the digital input circuit 130. The controller 110 is adapted to control the digital output circuit 120 and receive the logic signals from the digital input circuit 130. The controller 110 may be implemented as a microprocessor, a Complex Programmable Logic Device (CPLD), a Field-Programmable Gate Array (FPGA), a logic circuit, an analog circuit, a digital circuit, and/or any processing elements based on operating signals (analog and/or digital) and operation commands, but the instant disclosure is not limited thereto. The digital output circuit 120 and the digital input circuit 130 may be implemented as a microprocessor, a Complex Programmable Logic Device (CPLD), a Field-Programmable Gate Array (FPGA), a logic circuit, and/or any digital input/output circuits, but the instant disclosure is not limited thereto. In some embodiments, the controller 110, the digital output circuit 120, and the digital input circuit 130 can be integrated as a one element.

The switch circuits 140 are arranged in an array manner corresponding to the layout of the keys 190 of the keyboard. Each of the switch circuits 140 comprises a key switch 141 and a first resistor 142. The key switch 141 and the first resistor 142 are connected in series in the same switch circuit 140. Hence, when a key 190 is not pressed, the corresponding key switch 141 is in a disconnection state, so that the key switch 141 blocks the current passing through the first resistor 142. Conversely, when the key 190 is pressed, the corresponding key switch 141 is in a connection state, so that the current passes through the corresponding first resistor 142. Each of the switch circuits 140 is coupled between a scan line 150 and a feedback line 160. In some embodiments, for the sake of clarity, the keyboard corresponding to the switch circuit 140 is presented as a keyboard with a 6×4 key matrix. The number of keys 190 in this keyboard is merely illustrative, and the instant disclosure is not limited thereto.

Each of the scan lines 150 comprises an input terminal 151 and a plurality of switch terminals 152. The input terminal 151 of the scan lines 150 is coupled to the digital output circuit 120. The switch terminals 152 of the same scan line 150 are respectively coupled to the switch circuits 140 of the same column in a first direction (herein the lateral direction), in a one-to-one manner. The scan lines 150 are respectively coupled to the switch circuits 140 of different column in the first direction.

Each of the feedback lines 160 comprises a connecting terminal 161 and an outputting terminal 162. The connecting terminal 161 of the same feedback line 160 is coupled to the same row of switching circuits 140 in a second direction (herein the longitudinal direction). The feedback lines 160 are respectively coupled to the switch circuits 140 of different rows in the second direction. The connecting terminals 161 of the feedback lines 160 are respectively coupled to the first resistor 142 of the switch circuit 140. The outputting terminals 162 of the feedback lines 160 are respectively coupled to the digital input circuit 130.

It should be noted that, the array-configured keyboard scanning circuit 100, the first direction and the second direction shown in FIG. 1 are provided as illustrative purposes for presenting the equivalent connection relationship of the switch terminal 152, the switch circuit 140, and the connecting terminal 161 in a convenience manner, and the instant disclosure is not limited thereto. That is, as long as the connection relationship between the switch terminal 152, the switch circuit 140, and the connecting terminal 161 satisfies the aforementioned connection relationships, the instant disclosure is not limited to the arrangement of the first direction and the second direction.

The digital output circuit 120 is adapted to output two voltage level signals (also named as "input signals" in the instant disclosure), which are a high state output voltage ($V_{OH}$) and a low state output voltage ($V_{OL}$), respectively. The controller 110 controls the digital output circuit 120 to perform a plurality of scanning rounds during the controller 110 executes a scanning procedure. In each of the scanning rounds, the digital output circuit 120 outputs a set of input signals. The input signals received by one of the scan lines 150 is a detection signal V2, and the input signal received by the other scan lines 150 is a level signal V1. The detection signal V2 and the level signal V1 are a combination of a high state output voltage ($V_{OH}$) and a low state output voltage ($V_{OL}$). Hence, if the detection signal V2 is a high state output voltage ($V_{OH}$), then the level signal V1 is the low state output voltage ($V_{OL}$); conversely, if the detection signal V2 is the low state output voltage ($V_{OL}$), then the level signal V1 is the high state output voltage ($V_{OH}$). In each of the scanning rounds, the scan lines 150 receiving the input signal of the detection signal V2 are different. In some embodiments, in the scanning rounds, each of the scan lines 150 sequentially receives the input signals which are the detection signal V2. The input signals pass through the scan line 150 to one of two terminals of the switch circuit 140, and the other terminal of the switch circuit 140 transmits the output signal So to the digital input circuit 130 via the corresponding feedback line 160. Therefore, the output signal So are to be in different states when the key switch 141 is in a connection state (i.e., when the corresponding key 190 is pressed) or a disconnection state (i.e., when the corresponding key 190 is not pressed). Therefore, it is possible to know whether the key 190 is pressed or not by the output signal So.

The keyboard scanning circuit 100 further comprises a plurality of second resistors 170 and a plurality of third resistors 180. One of two terminals of each of the second resistors 170 is coupled to the outputting terminal 162 of the corresponding feedback line 160 in a one-to-one manner, and the other terminal of each of the second resistors 170 is adapted to receive the level signal V1. The second resistor 170 is used as a pull-up resistor or a pull-down resistor according to whether the level signal V1 is a high state output voltage ($V_{OH}$) or a low sate output voltage ($V_{OL}$). Each of the third resistors 180 is coupled between the outputting terminal 162 and the connecting terminal 161 of the corresponding feedback line in a one-to-one manner.

The digital input circuit 130 is adapted to receive the output signal So via the feedback lines 160 and determine a logic signal corresponding to each of the output signals So to be a high logic level or a low logic level, according to a high state threshold voltage ($V_{TH}$) or a low state threshold voltage ($V_{TL}$). When the voltage value of the output signal So rises from a value less than the high state output voltage ($V_{OH}$) to be a value greater than the high output voltage ($V_{OH}$), the logic signal corresponding to the output signal So is a high logic level. Conversely, when the voltage value of the output signal So decreases from a value greater than the low state output voltage ($V_{OL}$) to be a value less than the low state output voltage ($V_{OL}$), the logic signal corresponding to the output signal So is a low logic level.

The controller 110 is adapted to receive the logic signals from the digital input circuit 130. In the scanning round, the controller 110 is adapted to determine the key switches 141 of the switch circuit 140 coupled to the scan lines 150 (the scan line 150 is the first scan line in the scanning round as shown in FIG. 1) receiving the detection signal V2 is in a connection state or a disconnection state respectively, according to whether each of the logic signal is a high logic level or a low logic level. The high state output voltage ($V_{OH}$), the low state output voltage ($V_{OL}$), the high state threshold voltage ($V_{TH}$), and the low state threshold voltage ($V_{TL}$) satisfy a threshold inequality as shown below. Wherein, n is the number of the connection states of the key switches 141 of the switch circuits 140 coupled to any feedback line 160. In the following, several embodiments will be used as examples to explain whether the key 190 can be correctly pressed based on the threshold inequality.

$$\begin{cases} V_{OH} > V_{TH} > \dfrac{V2 + (n-1)*V1}{n} > V_{TL} > V_{OL}, \\ \qquad \text{when } \dfrac{V2 + (n-1)*V1}{n} > V_{TL} \\ V_{OH} > V_{TH} \geq V_{TL} > \dfrac{V2 + (n-1)*V1}{n} > V_{OL}, \\ \qquad \text{when } V_{TL} > \dfrac{V2 + (n-1)*V1}{n} \end{cases}$$

Figure 2:
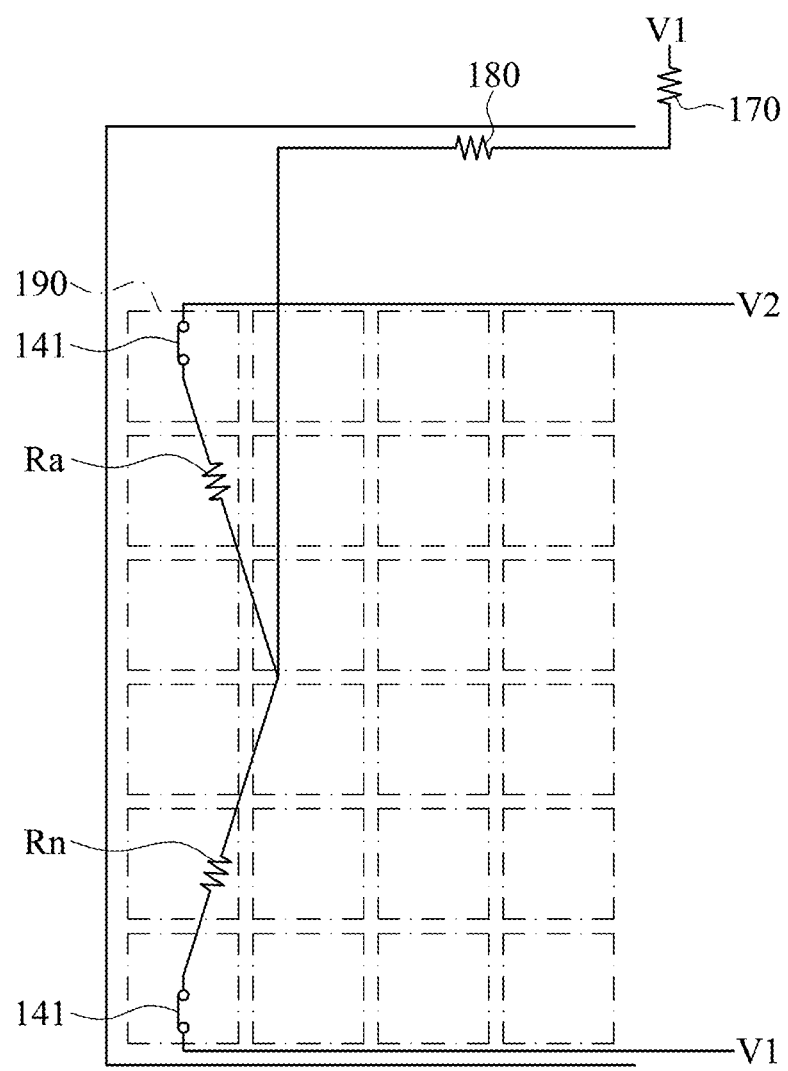
FIG. 2 illustrates an equivalent circuit diagram (1) of two pressed keys according to an embodiment of the instant disclosure.
Figure 3:
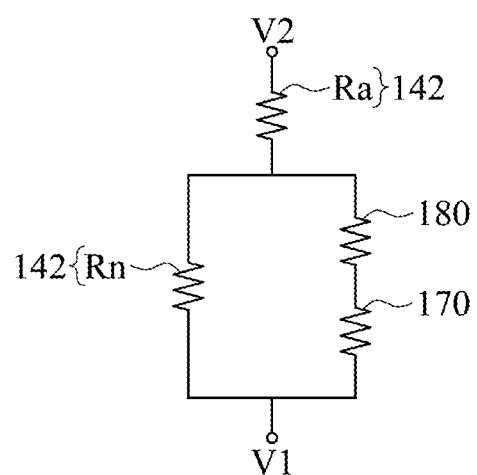
FIG. 3 illustrates an equivalent circuit diagram (2) of two pressed keys according to an embodiment of the instant disclosure.

FIG. 2 is an equivalent circuit diagram (1) of two pressed keys according to an embodiment of the instant disclosure. Herein, a first key KeyA (that is, a target key) on the scan line 150 receiving the detection signal V2 is pressed, and one of the remaining keys KeyN in the same row in the second direction is also pressed, that is, In Table 1, the state of the target key KeyA is "ON", and the states of the remaining key are "one remaining key is ON". FIG. 3 is an equivalent circuit diagram (2) of two pressed keys according to an embodiment of the instant disclosure. The circuit of FIG. 2 can be simplified to FIG. 3. It can be seen that a second resistor 170 is connected in series with a third resistor 180, and is connected in parallel with the first resistor Rn connected to the remaining key KeyN, and then is further connected in series with the first resistor Ra connected to the target key KeyA. Herein, the resistance of the second resistor 170 is greater than the resistance of the third resistor 180 by a first multiple, so that the resistance of the third resistor 180 can be omitted, when the third resistor 180 is connected in series with the second resistor 170. The resistance of the second resistor 170 is greater than the resistance of the first resistor 142 by a second multiple, so that the resistance of the second resistor 170 can be omitted when the first resistor Rn is connected in parallel with the second resistor 170. Therefore, the voltage of the output signal is substantially equivalent to the voltage across the first resistor Ra or the first resistor Rn in a voltage dividing circuit formed by the first resistor Ra or the first resistor Rn. For example, the resistance of the second resistor 170 may be 10 times greater than the resistance of the third resistor 180, and the resistance of the third resistor 180 may be 10 times greater than the resistance of the first resistor 142. Supposed that the impedance of the scan line 150 is 500 ohms, the resistance of the first resistor 142 is 5 k ohms, the resistance of the second resistor 170 is 500 k ohms, and the resistance of the third resistor 180 is 50 k ohms. Since the second resistor 170 is much greater than the third resistor 180, the resistance of the third resistor 180 can be omitted when the second resistor 170 and the third resistor 180 are connected in series. Further, the first resistor Ra and the aforementioned parallel circuit form a voltage dividing circuit, and the second resistor 170 is much greater than the first resistor Rn, so that the second resistor 170 can be omitted. Therefore, when the key switch 141 is in a connection state, the calculation of the voltage of the output signal So can be simplified to $$\frac{V2 + (n-1)*V1}{n},$$

where n is the number of the connection states of the key switch 141 of the switch circuit 140 coupled to the feedback line 160.

Referring to Table 1, Table 1 is provided for explaining a comparative example of an output signal So when a different key 190 is pressed. Herein, the system voltage (VDD) is 5 volts as reference. The high state output voltage ($V_{OH}$) is 5 volts, and the low state output voltage ($V_{OL}$) is 0 volts. The high state threshold voltage ($V_{TH}$) is 0.7 times multiple of the system voltage (VDD); that is, 3.5 volts. The low threshold voltage ($V_{TL}$) is 0.3 times multiple of the system voltage (VDD); that is, 1.5 volts. The level signal V1 is 5 volts, and the detection signal V2 is 0 volt. According to the foregoing calculation formula of the output signal So, the voltage value of the output signal So listed in Table 1 can be calculated. Based on that the high threshold voltage ($V_{TH}$) is 3.5 volts, when in the cases of "3 remaining keys are ON", "4 remaining keys are ON" and "5 remaining keys are ON", the logic signal will be misjudged to be the high logic level, and then the target key will also be misjudged to be OFF.

TABLE 1

| Target key state | Remaining key state | Output signal So | Logic signal |
|---|---|---|---|
| OFF | | V 1 = 5 V | High logic level |
| ON | 0 remaining keys are ON | V 2 = 0 V | Low logic level |
| ON | 1 remaining keys are ON | V 1*½ = 2.5 V | Low logic level |
| ON | 2 remaining keys are ON | V 1*⅔ = 3.33 V | Low logic level |
| ON | 3 remaining keys are ON | V 1*¾ = 3.75 V | High logic level |
| ON | 4 remaining keys are ON | V 1*⅘ = 4 V | High logic level |
| ON | 5 remaining keys are ON | V 1*⅚ = 4.17 V | High logic level |

In order to solve the above problem, the high state threshold voltage ($V_{TH}$) can be increased, so that the high state threshold voltage ($V_{TH}$) is between the high state output voltage ($V_{OH}$) and the maximum value of the output signal So when the state of target key is "ON", for example, the high state threshold voltage ($V_{OH}$) can be changed to 4.58 volts. Alternatively, the high state output voltage ($V_{OH}$) can be decreased, for example, the high state output voltage ($V_{OH}$) can be changed to 3.8 volts, as shown in Table 2.

TABLE 2

| Target key state | Remaining key state | Output signal So | Logic signal |
|---|---|---|---|
| OFF | | V 1 = 3.8 V | High logic level |
| ON | 0 remaining keys are ON | V 2 = 0 V | Low logic level |

TABLE 2-continued

| Target key state | Remaining key state | Output signal So | Logic signal |
|---|---|---|---|
| ON | 1 remaining keys are ON | V 1*½ = 1.9 V | Low logic level |
| ON | 2 remaining keys are ON | V 1*⅔ = 2.53 V | Low logic level |
| ON | 3 remaining keys are ON | V 1*¾ = 2.85 V | Low logic level |
| ON | 4 remaining keys are ON | V 1*⅘ = 3.04 V | Low logic level |
| ON | 5 remaining keys are ON | V 1*⅚ = 3.16 V | Low logic level |

Referring to Table 3, Table 3 is provided for explaining another comparative example of an output signal So when a different key 190 is pressed. As in the previous comparison, the system voltage (VDD) is 5 volts as reference. The high state output voltage ($V_{OH}$) is 5 volts, and the low state output voltage ($V_{OL}$) is 0 volts. The high state threshold voltage ($V_{TH}$) is 0.7 times multiple of the system voltage (VDD); that is, 3.5 volts. The low state threshold voltage ($V_{TL}$) is 0.3 times multiple of the system voltage (VDD); that is, 1.5 volts. The difference is that, in this comparative example, the level signal V1 is 0 volts, and the detection signal V2 is 5 volts. According to the calculation formula of the output signal So, the voltage value of the output signal So listed in Table 3 can be calculated. Based on that the low state threshold voltage ($V_{TL}$) is 1.5 volts, when in the cases of "3 remaining keys are ON", "4 remaining keys are ON" and "S remaining keys are ON", the logic signal will be misjudged to be the low logic level, and then the target key will also be misjudged to be OFF.

TABLE 3

| Target key state | Remaining key state | Output signal So | Logic signal |
|---|---|---|---|
| OFF | | V 1 = 0 V | Low logic level |
| ON | 0 remaining keys are ON | V 2 = 5 V | High logic level |
| ON | 1 remaining keys are ON | V ²⁄₂ = 2.5 V | High logic level |
| ON | 2 remaining keys are ON | V ⅔ = 1.67 V | High logic level |
| ON | 3 remaining keys are ON | V ²⁄₄ = 1.25 V | Low logic level |
| ON | 4 remaining keys are ON | V ⅖ = 1 V | Low logic level |
| ON | 5 remaining keys are ON | V ²⁄₆ = 0.83 V | Low logic level |

In order to solve the above problem, the low state threshold voltage ($V_{TL}$) can be decreased, so that the low state threshold voltage ($V_{TL}$) is between the low output voltage ($V_{OL}$) and the minimum value of the output signal So when the target key state is "ON", for example, the low state threshold voltage ($V_{TL}$) can be changed to 0.42 volts. Alternatively, the low output voltage ($V_{OL}$) can be increased, for example, the low output voltage ($V_{OL}$) can be changed to 1.2 volts, as shown in Table 4.

TABLE 4

| Target key state | Remaining key state | Output signal So | Logic signal |
|---|---|---|---|
| OFF | | V 1 = 1.2 V | Low logic level |

TABLE 4-continued

| Target key state | Remaining key state | Output signal So | Logic signal |
|---|---|---|---|
| ON | 0 remaining keys are ON | V 2 = 5 V | High logic level |
| ON | 1 remaining keys are ON | V 2/2 = 3.1 V | High logic level |
| ON | 2 remaining keys are ON | V 2/3 = 2.47 V | High logic level |
| ON | 3 remaining keys are ON | V 2/4 = 2.15 V | High logic level |
| ON | 4 remaining keys are ON | V 2/5 = 1.96 V | High logic level |
| ON | 5 remaining keys are ON | V 2/6 = 1.83 V | High logic level |

The aforementioned embodiment is explained by having the high state threshold voltage ($V_{TH}$) and the low state threshold voltage ($V_{TL}$) being different due to hysteresis. For the keyboard scanning circuit 100 of the digital input circuit 130 with the hysteresis, the digital output circuit 120 inputs a consistent input signal to each of the scan lines 150 before the beginning of the scanning round (such as the digital output circuit 120 inputs a high state output voltage ($V_{OH}$) or a low state output voltage ($V_{OL}$) to each of the scan lines 150), and the scanning round is performed after the scan lines 150 reached to a steady state.

In order to solve the aforementioned problem, the high state output voltage ($V_{OH}$) can be increased, for example, the high state output voltage ($V_{OH}$) changes to 1.9 times multiple of the system voltage (VDD); that is, 9.5 volts, and the results are shown in Table 5.

TABLE 5

| Target key state | Remaining key state | Output signal So | Logic signal |
|---|---|---|---|
| OFF | | V 1 = 0 V | Low logic level |
| ON | 0 remaining keys are ON | V 2 = 9.5 V | High logic level |
| ON | 1 remaining keys are ON | V 2/2 = 4.75 V | High logic level |
| ON | 2 remaining keys are ON | V 2/3 = 3.17 V | High logic level |
| ON | 3 remaining keys are ON | V 2/4 = 2.38 V | High logic level |
| ON | 4 remaining keys are ON | V 2/5 = 1.90 V | High logic level |
| ON | 5 remaining keys are ON | V 2/6 = 1.58 V | High logic level |

In some embodiments, the keyboard scanning circuit 100 comprises a limiter circuit (not shown in figure) coupled between the feedback line 160 and the digital input circuit 130. The limiter circuit may be, but not limited to, a Zener diode. Due to the function of the limiter circuit, the actual high state output voltage ($V_{OH}$) received by the digital input circuit 130 does not exceed the system voltage (VDD). That is, in these embodiments, the limiter circuit can prevent the digital input circuit 130 and the chip in the controller 110 from being damaged or out of order due to a latch-up effect.

For the digital input circuit 130 without hysteresis (that is, the high state threshold voltage ($V_{TH}$) is equal to or close to the low state threshold voltage ($V_{TL}$)), it is not necessary to input a consistent input signal before the beginning of the scanning round. The output signal So of the pressing situation of the different keys 190 is as shown in Table 6. Herein, the system voltage (VDD) is 5 volts as reference. The high state output voltage ($V_{OH}$) is 5 volts, and the low state output voltage ($V_{OH}$) is 0 volt. The high state threshold voltage ($V_{TH}$) and the low state threshold voltage ($V_{TL}$) is 4.72 volts. The level signal V1 is 5 volts, and the detection signal V2 is 0 volt.

TABLE 6

| Target key state | Remaining key state | Output signal So | Logic signal |
|---|---|---|---|
| OFF | | V 1 = 5 V | High logic level |
| ON | 0 remaining keys are ON | V 2 = 0 V | Low logic level |
| ON | 1 remaining keys are ON | V 1*1/2 = 2.5 V | Low logic level |
| ON | 2 remaining keys are ON | V 1*2/3 = 3.33 V | Low logic level |
| ON | 3 remaining keys are ON | V 1*3/4 = 3.75 V | Low logic level |
| ON | 4 remaining keys are ON | V 1*4/5 = 4 V | Low logic level |
| ON | 5 remaining keys are ON | V 1*5/6 = 4.17 V | Low logic level |

In some embodiments, the keyboard scanning circuit 100 has a power-saving mode. In the power-saving mode, all the input signals received by the scan line 150 are set to the detection signal V2. When all the keys 190 are not pressed, the output signals So are the level signal V1. When any of the keys 190 is pressed (i.e., the key switch 141 is in the connection state), the corresponding output signal So will be changed and not be the level signal V1, and it can be a wake-up condition to wake up the controller 110 when the controller 110 is in the power-saving mode.

Figure 4:
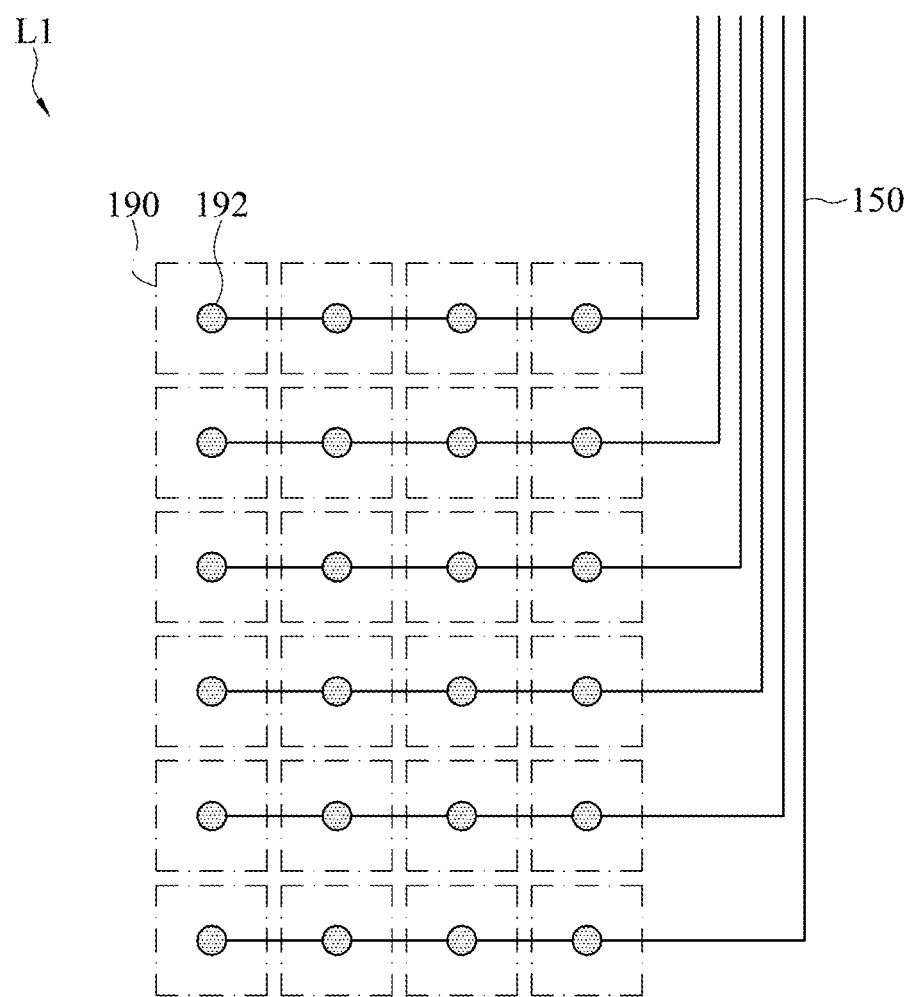
FIG. 4 illustrates a layout schematic view (1) of a first layer of a multilayer circuit board of a keyboard scanning circuit according to a comparative example of the instant disclosure.
Figure 5:
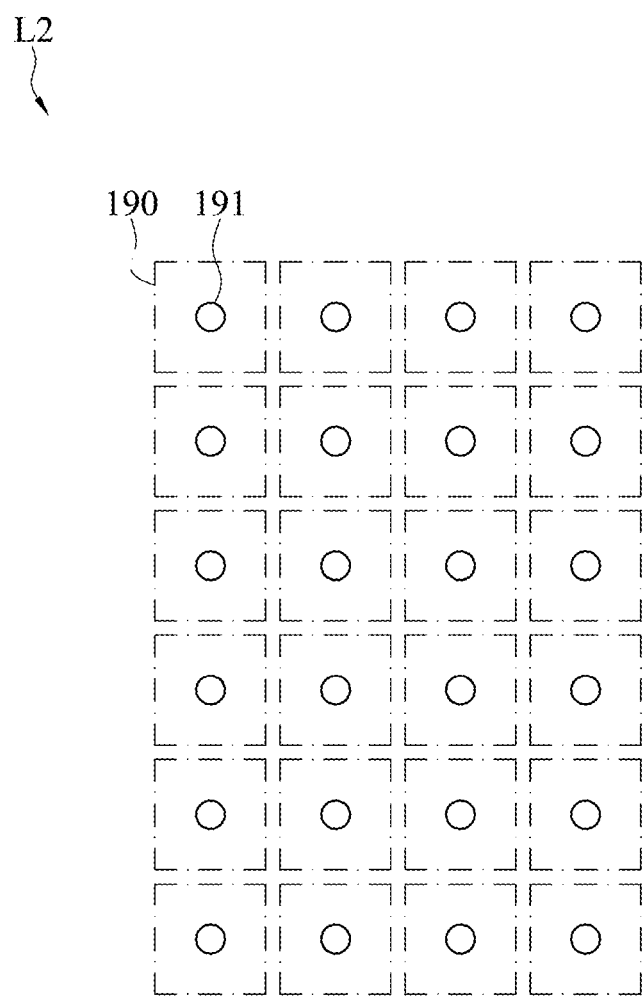
FIG. 5 illustrates a layout schematic view (2) of a second layer of a multilayer circuit board of a keyboard scanning circuit according to a comparative example of the instant disclosure.
Figure 6:
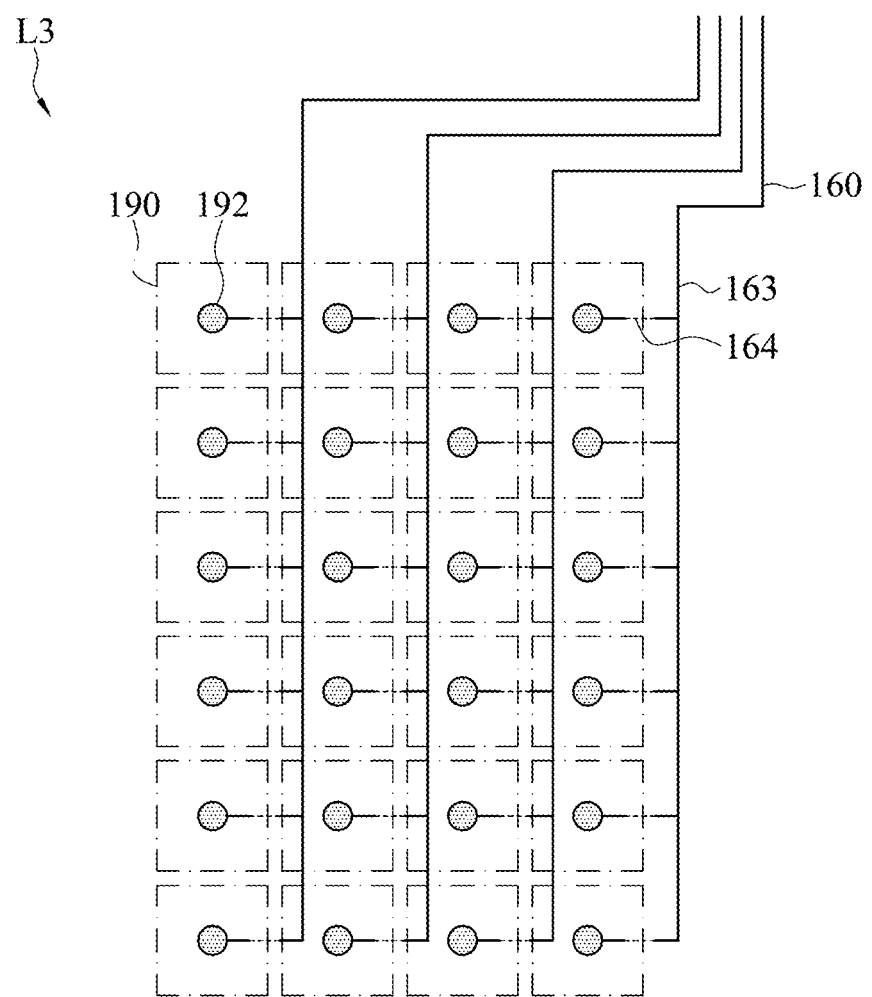
FIG. 6 illustrates a layout schematic view (3) of a third layer of a multilayer circuit board of a keyboard scanning circuit according to a comparative example of the instant disclosure.

As shown in FIG. 4 to FIG. 6, layout schematic views of the layers of a multilayer circuit board of a keyboard scanning circuit 100 according to a comparative example of the instant disclosure are illustrated. The multilayer circuit board of the keyboard scanning circuit 100 has three layers, namely, a first layer L1, a second layer 12, and a third layer L3, wherein the second layer L2 is located between the first layer L1 and the third layer L3. Through holes 191 are formed in the second layer L2 of the multilayer circuit board and correspond to the keys 190, so that contact points 192 on the first layer L1 and contact points 192 on the third layer L3 can be in contact with each other, respectively, when the keys are pressed. FIG. 4 illustrates the layout of the scan lines 150; that is, the first layer L1 of the multilayer circuit board. FIG. 5 illustrates the layout of the isolation layer; that is, the second layer 12 of the multilayer circuit board. FIG. 6 illustrates the layout of the feedback lines 160; that is, the third layer L3 of the multilayer circuit board. It can be seen that, each of the feedback lines 160 is formed by two parts comprise a low impedance trace 163 (solid line portion) and a high impedance trace 164 (dashed line portion), and the high impedance trace 164 is used as a resistor. In the case that the low impedance trace 163 and the high impedance trace 164 are fabricated by ink printing, two separate printing procedures are applied. That is, the low impedance trace 163 is printed first, and then the high impedance trace 164 is printed.

Figure 7:
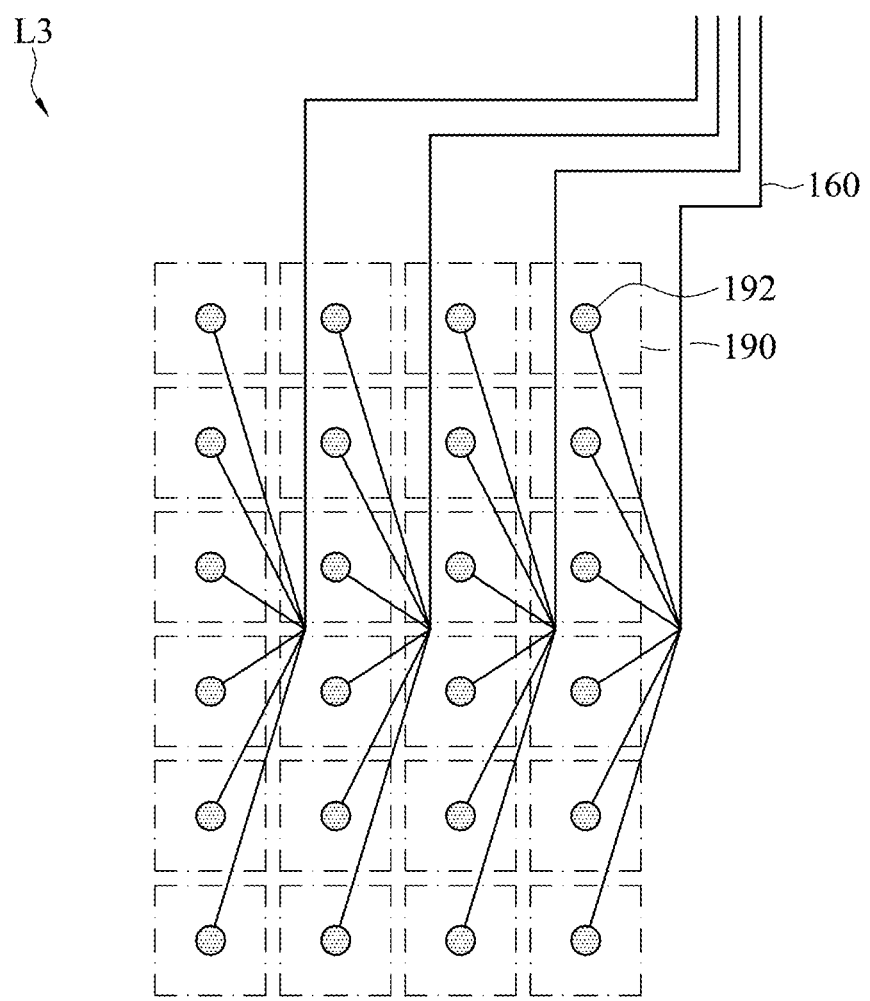
FIG. 7 illustrates a layout schematic view of a layer with feedback lines according to an embodiment of the instant disclosure.
Figure 8:
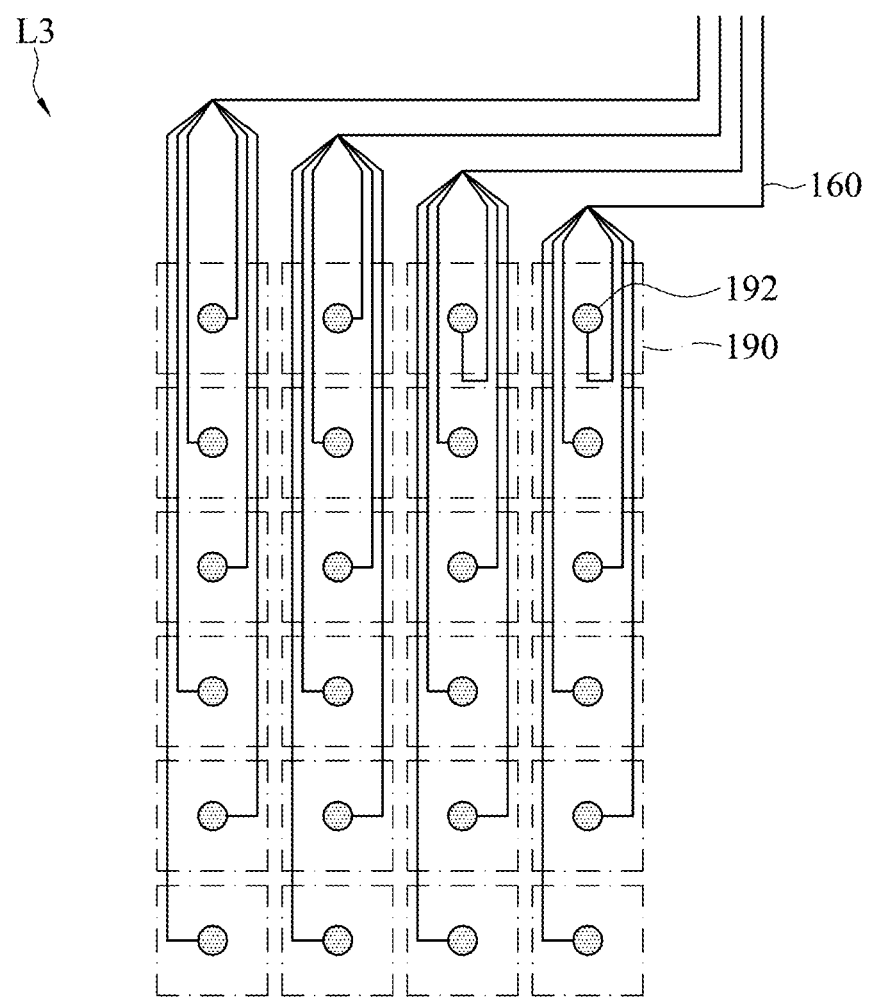
FIG. 8 illustrates a layout schematic view of a layer with feedback lines according to another embodiment of the instant disclosure.
Figure 9:
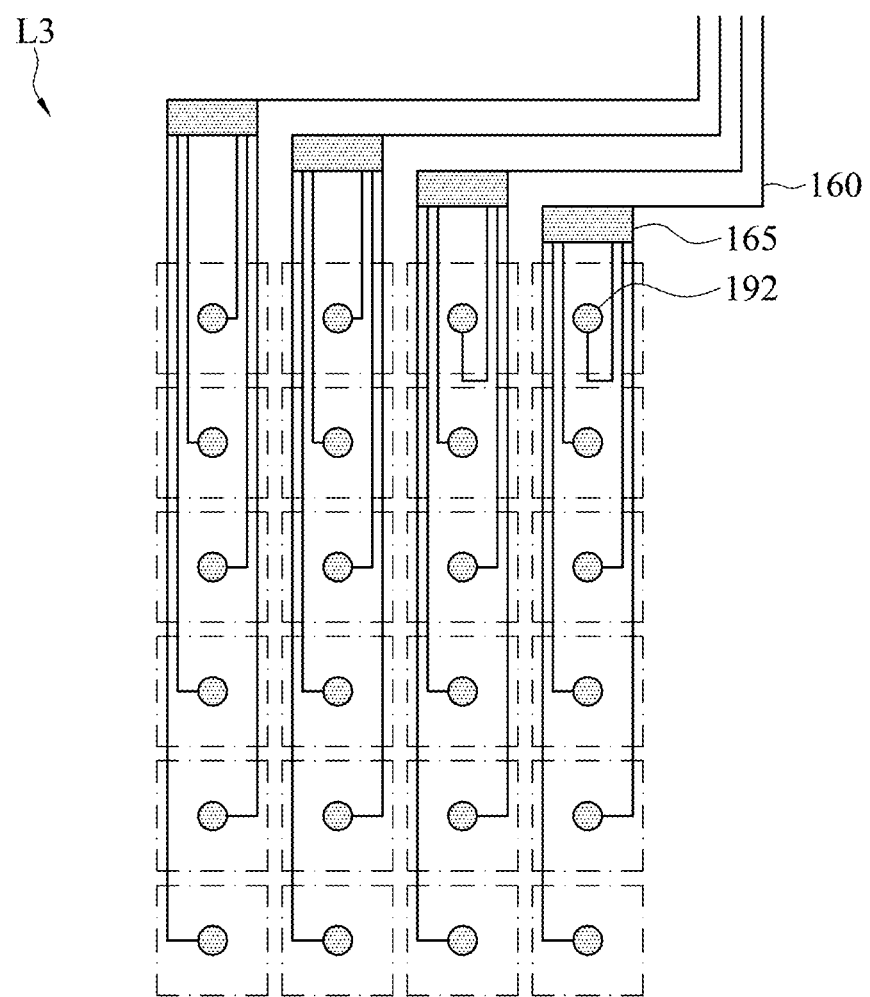
FIG. 9 illustrates a layout schematic view of a layer with feedback lines according to still another embodiment of the instant disclosure.

As mentioned above, in one or some embodiments of the instant disclosure, the first resistor 142 is much greater than the line impedance of the scan line 150, the third resistor 180 is much greater than the first resistor 142, and the second resistor 170 is much greater than the third resistor 180. Therefore, each of the feedback lines 160, the third resistors 180 coupled to each of the feedback lines 160, and the first resistors 142 of the switch circuits 140 are implemented by high impedance traces. In some embodiments, the high impedance traces may be fabricated by a one-time high impedance ink (e.g., toner) printing, although the instant disclosure is not limited thereto. As shown in FIG. 7 to FIG. 9, layout schematic views of a layer with a feedback line 160 respectively according to embodiments of the instant disclosure. As shown in FIG. 7 to FIG. 9, the high impedance traces are divergently connected to the same row of keys 190 in the second direction. The feedback lines 160 shown in FIG. 7 extend from the periphery of the keyboard to spaces between the keys 190, and then diverge to each of the keys 190. The feedback lines 160 shown in FIG. 8 are routed at the upper edge of the keyboard, and then diverge to each of the keys 190. The feedback lines 160 shown in FIG. 9 even expands the line width at the divergence point 165 to reduce the resistance. The aforementioned layouts are only for illustrative examples, and the embodiment of the instant disclosure is not limited thereto.

Figure 10:
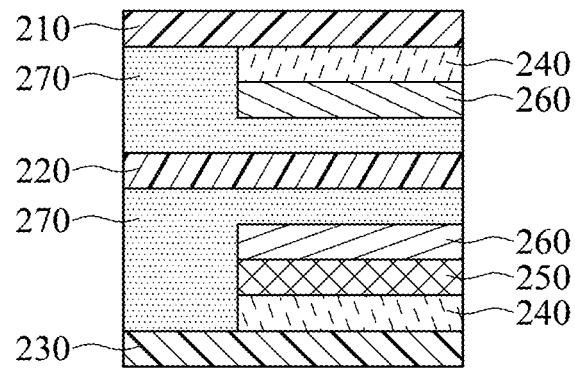
FIG. 10 illustrates a schematic sectional view of a multilayer circuit board of a keyboard scanning circuit according to a comparative example of the instant disclosure.

FIG. 10 illustrates a schematic sectional view of a multilayer circuit board of a keyboard scanning circuit 100 according to a comparative example of the instant disclosure. It can be seen that, the first layer L1, the second layer L2, and the third layer L3 of the aforementioned multilayer circuit board can be further subdivided into three substrate layers 210, 220, 230. The layers disposed between the three substrate layers 210, 220 and 230 further comprise the low impedance trace layer 240, the high impedance trace layer 250, the jumper layer 260, and the waterproof layer 270. In this comparative embodiment, the substrate layer 220 is the second layer L2, and the first layer L1 and the third layer L3 used the substrate layer 220 (the second layer L2) as the boundary, and the layers above the substrate layer 220 are the first layer L1 and the layers below the substrate layer 220 are the third layer L3.

Figure 11:
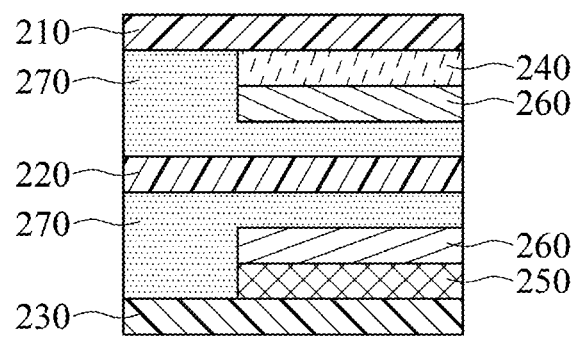
FIG. 11 illustrates a schematic sectional view of a multilayer circuit board of a keyboard scanning circuit according to an embodiment of the instant disclosure.
Figure 12:
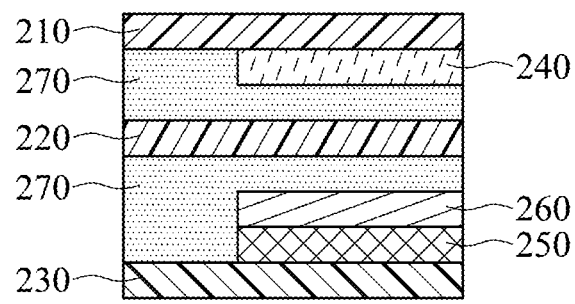
FIG. 12 illustrates a schematic sectional view of a multilayer circuit board of a keyboard scanning circuit according to another embodiment of the instant disclosure.

FIG. 11 illustrates a schematic sectional view of a multilayer circuit board of a keyboard scanning circuit 100 according to an embodiment of the instant disclosure. It can be seen that, in addition to the jumper layer 260 and the waterproof layer 270 formed between the three substrate layers 210, 220, and 230, in this embodiment, the low impedance trace layer 240 is disposed on the layer of the scan lines 150 (the first layer L1); the high impedance trace layer 250 is disposed on the layer of the feedback lines 160 (the third layer), but it is no necessary to dispose the low impedance trace layer 240 on the layer of the feedback lines 160 (the third layer L3). Hence, the process complexity can be simplified. FIG. 12 illustrates a schematic sectional view of a multilayer circuit board of a keyboard scanning circuit 100 according to another embodiment of the instant disclosure. The difference between FIG. 1 and FIG. 12 is that, in the embodiment shown in FIG. 12, the keys 190 are arranged regularly, and the jumper layer 260 can be omitted.

The aforementioned circuit board may be a thin film circuit board or a printed circuit board.

It should be noted that, in some embodiments, the stacking relationship of the multilayer circuit board is as follows: the substrate layer 220 (L2) taken as the isolation layer is sandwiched between the first layer L1 (layer of scan lines) and the third layer L3 (layer of feedback lines). Further, the instant disclosure is not limited to an embodiment where the layers above of the substrate layer 220 (L2) is the first layer L1 (layer of scan lines) and the layers below of the substrate layer 220 (L2) is the third layer L3 (layer of feedback lines). In some embodiments, the stacking relationship of the multilayer circuit board may also be that, the layers above of the substrate layer 220 (L2) is the third layer L3 (layer of feedback lines) and the layers below of the substrate layer 220 (L2) is the first layer L1 (layer of scan lines).

Figure 13:
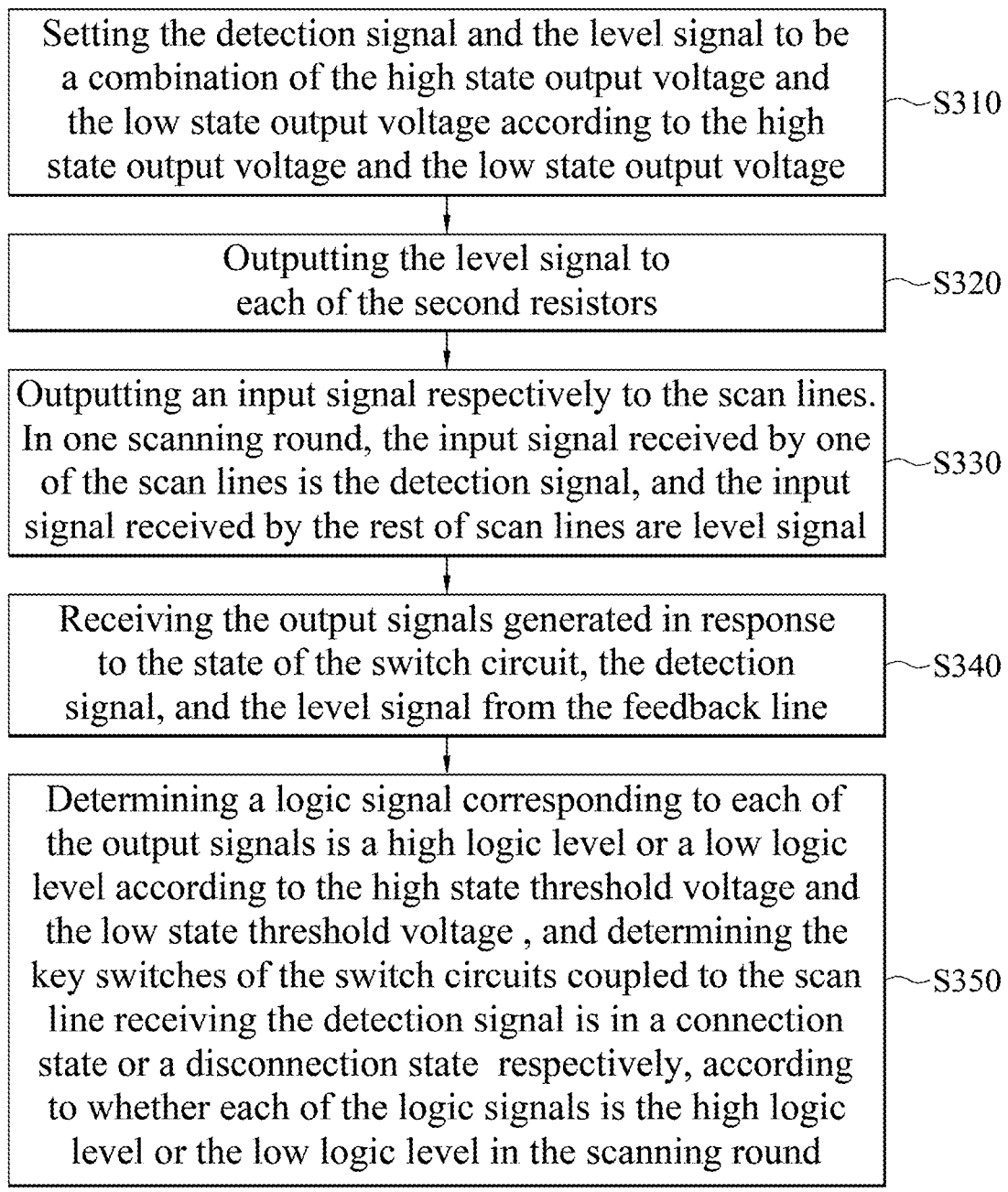
FIG. 13 illustrates a flowchart of a control method for keyboard scanning circuit according to an embodiment of the instant disclosure.

FIG. 13 illustrates a flowchart of a control method for a keyboard scanning circuit 100 according to an embodiment of the instant disclosure. First, setting the detection signal V2 and the level signal V1 to be a combination of the high state output voltage ($V_{OH}$) and the low state output voltage ($V_{OL}$) according to the high state output voltage ($V_{OH}$) and the low state output voltage ($V_{OL}$) (step S310). Next, outputting the level signal V1 to each of the second resistors 170 (step S320). In step S330, outputting an input signal respectively to the scan lines 150. In one scanning round, the input signal received by one of the scan lines 150 is the detection signal V2, and the input signal received by the rest of scan lines 150 are level signal V1. Then, receiving the output signals So generated in response to the state of the switch circuit 140, the detection signal V2, and the level signal V1 from the feedback line 160 (step S340). Next, determining a logic signal corresponding to each of the output signals is a high logic level or a low logic level according to the high state threshold voltage ($V_{TH}$) and the low state threshold voltage ($V_{TL}$), and determining the key switches 141 of the switch circuits 140 coupled to the scan line 150 receiving the detection signal V2 is in a connection state or a disconnection state respectively, according to whether each of the logic signals is the high logic level or the low logic level in the scanning round (step S350). Therefore, even if the keys 190 of the same row in the second direction are simultaneously pressed, the pressing condition can be correctly discriminated to prevent the ghost key condition from occurring.

Figure 14:
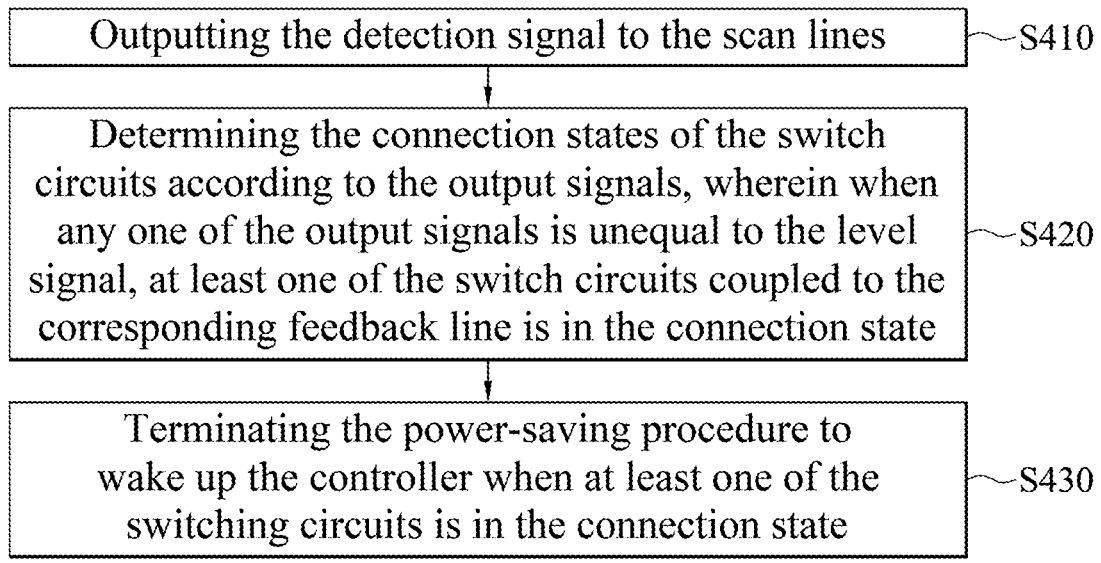
FIG. 14 illustrates a flowchart of a power-saving procedure for keyboard scanning circuit according to an embodiment of the instant disclosure.

FIG. 14 illustrates a flowchart of a power-saving procedure for a keyboard scanning circuit 100 according to an embodiment of the instant disclosure. First, outputting the detection signal (V2) to the scan lines 150 (step S410). Then, determining the connection states of the switch circuits 140 according to the output signals, wherein when any one of the output signals So is unequal to the level signal (V1), at least one of the switch circuits 140 coupled to the corresponding feedback line 160 is in the connection state (step S420). Next, terminating the power-saving procedure to wake up the controller 110 when at least one of the switching circuits 140 is in the connection state (step S430).

As above, according to one or some embodiments of the keyboard scanning circuit and the control method thereof of the instant disclosure, the keyboard scanning circuit and the control method thereof can avoid ghost keys, reduce process complexity, and provide power-saving and wake-up function.

What is claimed is:
1. A keyboard scanning circuit, comprising: a digital output circuit for outputting a high state output voltage (V.sub.OH) and a low state output voltage (V.sub.OL); a digital input circuit for receiving output signals, and determining a logic signal corresponding to each of the output signals to be a high logic level or a low logic level, according to a high state threshold voltage (V.sub.TH) and a low state threshold voltage (V.sub.TL); a plurality of switch circuits arranged in an array manner, and each of the switch circuits comprising: a key switch; and a first resistor connected in series to the key switch; a plurality of scan lines, each of the scan lines comprising: an input terminal coupled to the digital output circuit for receiving an input signal output by the digital output circuit, wherein in a scanning round, the input signal received by one of the scan lines is a detection signal (V2), the input signal received by rest of the scan lines is a level signal (V1), the detection signal (V2) and the level signal (V1) are a combination of the high state output voltage (V.sub.OH) and the low state output voltage (V.sub.OL); and a plurality of switch terminals, wherein the switch terminals of each of the scan lines are respectively coupled to, in a one-to-one manner, the switch circuits of the same column in a first direction; a plurality of feedback lines, each of the feedback lines comprising: a connecting terminal coupled to the switch circuits of the same row in a second direction; and an outputting terminal coupled to the digital input circuit for outputting the output signal; and a controller coupled to the digital output circuit and the digital input circuit, wherein the controller is adapted to control the digital output circuit to perform the scanning round, receive the logic signals from the digital input circuit, and determine the key switches of the switch circuits coupled to the scan line receiving the detection signal (V2) is in a connection state or a disconnection state respectively, according to whether each of the logic signals is the high logic level or the low logic level in the scanning round; and wherein the high state output voltage (V.sub.OH), the low state output voltage (V.sub.OL), the high state threshold voltage (V.sub.TH), and the low state threshold voltage (V.sub.TL) satisfy a threshold inequality, the threshold inequality is:

$$\begin{cases} V_{OH} > V_{TH} > \dfrac{V2 + (n-1) * V1}{n} > V_{TL} > V_{OL}, \\ \quad \text{when } \dfrac{V2 + (n-1) * V1}{n} > V_{TL} \\ V_{OH} > V_{TH} \geq V_{TL} > \dfrac{V2 + (n-1) * V1}{n} > V_{OL}, \\ \quad \text{when } V_{TL} > \dfrac{V2 + (n-1) * V1}{n} \end{cases}$$

wherein n is the number of the connection states of the key switches of the switch circuits coupled to any feedback line.

2. The keyboard scanning circuit of claim 1, further comprising:
a plurality of second resistors, wherein one of two terminals of each of the second resistors is coupled to the outputting terminal of the corresponding feedback lines in a one-to-one manner, and the other terminal of each of the second resistors is adapted to receive the level signal (V1), and the resistance of the second resistors is greater than the resistance of the first resistors.

3. The keyboard scanning circuit of claim 1, further comprising:
a plurality of third resistors, each of the third resistors coupled between the outputting terminal and the connecting terminal of the corresponding feedback line in a one-to-one manner, wherein the resistance of the third resistors is less than the resistance of the resistor.

4. The keyboard scanning circuit of claim 3, wherein the feedback lines, the third resistors coupled to the feedback lines, and the first resistors of the switch circuits form a divergent high impedance trace.

5. The keyboard scanning circuit of claim 1, wherein when the voltage value of the output signal rises from a value less than the high state output voltage ($V_{OH}$) to be a value greater than the high state output voltage ($V_{OH}$), the logic signal corresponding to the output signal is the high logic level; when the voltage value of the output signals decreases from a value greater than the low state output voltage ($V_{OL}$) to a value less than the low state output voltage ($V_{OL}$), the logic signal corresponding to the output signal is the low logic level.

6. The keyboard scanning circuit of claim 1, wherein in a power-saving mode, the input signals received by the scan lines are detection signals (V2), the controller determines the states of the switch circuits according to the output signals; wherein the controller is wakened when any of the output signals is unequal to the level signal (V1).

7. The keyboard scanning circuit of claim 1, wherein the switching circuits, the scan lines and the feedback lines form a multilayer circuit board, and the multilayer circuit board comprises:
a first layer with a low impedance trace layer, wherein the scan lines are disposed in the first layer;
a second layer comprising a plurality of through holes, each of the through holes is adapted to receive an external force to connect the corresponding scan line with the corresponding feedback line; and
a third layer with a high impedance trace layer, and the feedback lines are disposed in the third layer;
wherein the second layer is sandwiched between the first layer and the third layer.

8. A control method for keyboard scanning circuit, adapted to detect states of a plurality of switching circuits arranged in an array manner, wherein each of the switching circuits comprises a key switch and a first resistor connected in series; the switch circuits are coupled to a plurality of scan lines and a plurality of feedback lines; each of the scan lines is coupled to, in a one-to-one manner, the switch circuits of the same column in a first direction, and each of the feedback lines is coupled to the switch circuits of the same row in the second direction; the control method comprises: setting a detection signal (V2) and a level signal (V1) to be a combination of a high state output voltage (V.sub.OH) and a low state output voltage (V.sub.OL) according to the high state output voltage (V.sub.OH) and the low state output voltage (V.sub.OL); outputting an input signal to the scan lines respectively, wherein in a scanning round, the input signal received by one of the scan lines is a detection signal (V2), the input signal received by rest of the scan lines is a level signal (V1); receiving a plurality of output signals generated in response to the states of the switch circuits, the detection signal (V2), and the level signal (V1) from the feedback lines; and determining a logic signal corresponding to each of the output signals is a high logic level or a low logic level according to the high state threshold voltage (V.sub.TH) and the low state threshold voltage (V.sub.TL), and determining the key switches of the switch circuits coupled to the scan line receiving the detection signal (V2) is in a connection state or a disconnection state respectively, according to whether each of the logic signals is the high logic level or the low logic level in the scanning round, and wherein the high state output voltage (V.sub.OH), the low state output voltage (V.sub.OL), the high state threshold voltage (V.sub.TH), and the low state threshold voltage (V.sub.TL) satisfy a threshold inequality, the threshold inequality is:

$$\begin{cases} V_{OH} > V_{TH} > \dfrac{V2 + (n-1) * V1}{n} > V_{TL} > V_{OL}, \\ \quad \text{when } \dfrac{V2 + (n-1) * V1}{n} > V_{TL} \\ V_{OH} > V_{TH} \geq V_{TL} > \dfrac{V2 + (n-1) * V1}{n} > V_{OL}, \\ \quad \text{when } V_{TL} > \dfrac{V2 + (n-1) * V1}{n} \end{cases}$$

wherein n is the number of the connection states of the key switches of the switch circuits coupled to any feedback line.

9. The control method of claim 8, wherein each of the switch circuits is coupled to a first terminal of a second resistor in a one-to-one manner, the control method further comprises:
outputting the level signal (V1) to a second terminal of each of the second resistors.

10. The control method of claim 9, further comprising:
inputting a consistent input signal to the scan lines in advance before executing the scanning round, and executing the scanning round after the scan lines are at a steady state.

11. The control method of claim 9, further comprising a power-saving procedure, wherein the power-saving procedure comprises:
outputting the detection signal (V2) to the scan lines;
determining the connection states of the switch circuits according to the output signals, wherein when any one of the output signals is unequal to the level signal (V1), at least one of the switch circuits coupled to the corresponding feedback line is in the connection state; and
terminating the power-saving procedure when at least one of the switching circuits is in the connection state.

* * * * *

UNITED STATES PATENT AND TRADEMARK OFFICE
CERTIFICATE OF CORRECTION

PATENT NO. : 11,112,877 B2  
APPLICATION NO. : 16/785936  
DATED : September 7, 2021  
INVENTOR(S) : Chien-Tsung Chen Page 1 of 1

It is certified that error appears in the above-identified patent and that said Letters Patent is hereby corrected as shown below:

On the Title Page

Please add:  
-- (30) Foreign Application Priority Data  
Jun. 14, 2019   (TW) ........................................................ 108120795 --

Signed and Sealed this  
Twenty-ninth Day of November, 2022

Katherine Kelly Vidal  
*Director of the United States Patent and Trademark Office*